(12) United States Patent
Chen et al.

(10) Patent No.: US 12,089,331 B2
(45) Date of Patent: Sep. 10, 2024

(54) METAL CIRCUIT STRUCTURE BASED ON FPC AND METHOD OF MAKING THE SAME

(71) Applicant: Aplus Semiconductor Technologies Co., Ltd., Changzhou (CN)

(72) Inventors: Cheng-Neng Chen, Changzhou (CN);
Sui-Ho Tsai, Changzhou (CN);
Yun-Nan Wang, Changzhou (CN);
Chiao-Hui Wang, Changzhou (CN)

(73) Assignee: APLUS SEMICONDUCTOR TECHNOLOGIES CO., LTD., Changzhou (CN)

( * ) Notice: Subject to any disclaimer, the term of this patent is extended or adjusted under 35 U.S.C. 154(b) by 0 days.

(21) Appl. No.: 17/314,131

(22) Filed: May 7, 2021

(65) Prior Publication Data

US 2022/0361336 A1 Nov. 10, 2022

(51) Int. Cl.
*H05K 1/14* (2006.01)
*C23C 14/34* (2006.01)
(Continued)

(52) U.S. Cl.
CPC .............. *H05K 1/147* (2013.01); *C23C 14/34* (2013.01); *C23C 14/5873* (2013.01); *C23C 18/1637* (2013.01); *C23C 28/023* (2013.01); *C25D 5/022* (2013.01); *C25D 5/10* (2013.01); *G03F 7/0041* (2013.01); *G03F 7/2016* (2013.01); *H05K 1/11* (2013.01); *H05K 2201/032* (2013.01); *H05K 2201/0338* (2013.01); *H05K 2201/0341* (2013.01)

(58) Field of Classification Search
CPC ......... H05K 3/244; H05K 2201/09445; H05K 2203/243; H05K 1/147; H05K 2201/032; H05K 2201/0338; H05K 2201/0341; C23C 14/34; C23C 14/5873; C23C 18/1637; C23C 28/023; C23C 28/028; C25D 5/022; C25D 5/10; G03F 7/0041; G03F 7/2016
See application file for complete search history.

(56) References Cited

U.S. PATENT DOCUMENTS

| | | | |
|---|---|---|---|
| 6,687,324 B1 * | 2/2004 | Boller | B32B 15/01 420/560 |
| 2009/0025968 A1 * | 1/2009 | Ooyabu | H05K 3/244 174/257 |

(Continued)

OTHER PUBLICATIONS

English Translation JP2002289652, Hitachi Cable Ltd (Year: 2002).*

*Primary Examiner* — Steven T Sawyer
(74) *Attorney, Agent, or Firm* — Chun-Ming Shih; LANWAY IPR SERVICES

(57) ABSTRACT

A metal circuit structure based on a flexible printed circuit (FPC) contains: a substrate, a first metal layer attached on the substrate, a second metal layer formed on the first metal layer, and an intermediate layer defined between the first metal layer and the second metal layer. A first surface of the intermediate layer is connected with the first metal layer, and a second surface of the intermediate layer is connected with the second metal layer. The intermediate layer is made of a first material, the second metal layer is made of a second material, and the first material of the intermediate layer does not act with the second material of the second metal layer.

3 Claims, 2 Drawing Sheets

(51) Int. Cl.

|  |  |
|---|---|
| *C23C 14/58* | (2006.01) |
| *C23C 18/16* | (2006.01) |
| *C23C 28/02* | (2006.01) |
| *C25D 5/02* | (2006.01) |
| *C25D 5/10* | (2006.01) |
| *G03F 7/004* | (2006.01) |
| *G03F 7/20* | (2006.01) |
| *H05K 1/11* | (2006.01) |

(56) References Cited

U.S. PATENT DOCUMENTS

| | | | |
|---|---|---|---|
| 2013/0014978 A1* | 1/2013 | Uzoh | H01L 24/05 |
| | | | 174/257 |
| 2013/0236742 A1* | 9/2013 | Weitershaus | C25D 5/12 |
| | | | 205/176 |
| 2014/0217579 A1* | 8/2014 | Ganesan | H01L 24/16 |
| | | | 257/737 |
| 2015/0228629 A1* | 8/2015 | Tsai | H01L 25/0753 |
| | | | 257/89 |
| 2015/0382445 A1* | 12/2015 | Choi | H05K 1/189 |
| | | | 174/251 |
| 2019/0059153 A1* | 2/2019 | Liu | H05K 3/4676 |
| 2019/0237421 A1* | 8/2019 | Tsuchiya | H01L 24/11 |
| 2022/0336985 A1* | 10/2022 | Kamamoto | H01B 7/0045 |

\* cited by examiner

METAL CIRCUIT STRUCTURE BASED ON FPC AND METHOD OF MAKING THE SAME

FIELD OF THE INVENTION

The present invention relates to a metal circuit structure, and more particularly to a metal circuit structure based on FPC and a method of making the same.

BACKGROUND OF THE INVENTION

A flexible printed circuit (FPC) is made of polyimide or polyester film to have a high reliability and flexibility, and the FPC has high wiring density, compact weight, and thin thickness.

Chip On Flex (COF) or Chip On Film (COF) is applied to fix a drive integrated circuit (IC) on a chip of a flexible circuit board, wherein a substrate is flexible and is configured to carry and adhere the chips with the flexible circuit board, and the COF is capable of obtaining high accuracy of FPC. However, a thickness of tin of COP is thick. The COF has many tiny circuits attached on a film so as to avoid a removal. In addition, the circuits are hot pressed with pins of a chip, so it is necessary to have immersion tin on the circuits. To maintain a thickness of tin on the circuits after a baking process, the thickness of the tin is increased after having immersion tin on the circuits, but a height of the circuits increase to cause a removal of the film from the circuits. Furthermore, the thickness of the tin cannot be controlled exactly, thus increasing defective rate and fabrication cost.

The present invention has arisen to mitigate and/or obviate the afore-described disadvantages.

SUMMARY OF THE INVENTION

One aspect of the present invention is to provide a metal circuit structure based on a flexible printed circuit (FPC) and a method of making the same which avoid diffusion of tin and copper of the metal circuit structure, a change of a thickness of the tin, and a height of the circuit.

Another aspect of the present invention is to provide a metal circuit structure based on a flexible printed circuit (FPC) and a method of making the same which contain an intermediate layer between the first metal layer and the second metal layer to separate the first metal layer from the second metal layer, thus maintaining a thickness of the second metal layer and avoiding a removal from the substrate because of an increasing height of the circuit.

To obtain the above aspects, a metal circuit structure based on a flexible printed circuit (FPC) and a method of making the same provided by the present invention contain: a substrate, a first metal layer attached on the substrate, a second metal layer formed on the first metal layer, and an intermediate layer defined between the first metal layer and the second metal layer.

A first surface of the intermediate layer is connected with the first metal layer, and a second surface of the intermediate layer is connected with the second metal layer.

The intermediate layer is made of a first material, the second metal layer is made of a second material, and the first material of the intermediate layer does not act with the second material of the second metal layer.

Preferably, the intermediate layer is made of any one or at least two of titanium, nickel, chromium, molybdenum, tungsten, cobalt, vanadium, and niobium.

Preferably, the first metal layer is made of copper, and a thickness of the first metal layer is 1 µm to 12 µm.

Preferably, the second metal layer is made of tin, and a thickness of the second metal layer is 100 nm to 200 nm.

Preferably, the metal circuit structure further contains two third metal layers formed on two sides of the first metal layer. Preferably, the third metal layer is made of speculum metal.

Preferably, a thickness of the intermediate layer is 5 nm to 50 nm.

A method of making the metal circuit structure contains steps of:
S10) plating copper on the substrate so as to form the first metal layer;
S20) forming the intermediate layer on the first metal layer;
S30) plating copper on the intermediate layer so as to form a copper layer;
S40) having immersion tin on the circuit; and
S50) backing the first metal layer after steps of S10) and S20) so as to release stress form the first metal layer and to maintain a stable crystalline state.

The method of making the metal circuit structure further contains:
S00) sputtering metal atoms on the substrate so as to form a seed layer and adhering a photoresist film on the seed layer to execute exposure and developing treatment so that a portion of the seed layer on which no metal circuit is arranged, is covered by a photoresist.

Furthermore, in the step S40), the photoresist is washed away, and the substrate is micro-nano etched until the portion of the seed layer on which no metal circuit is arranged, is etched completely.

DETAILED DESCRIPTION OF THE PREFERRED EMBODIMENTS

Figure 1:
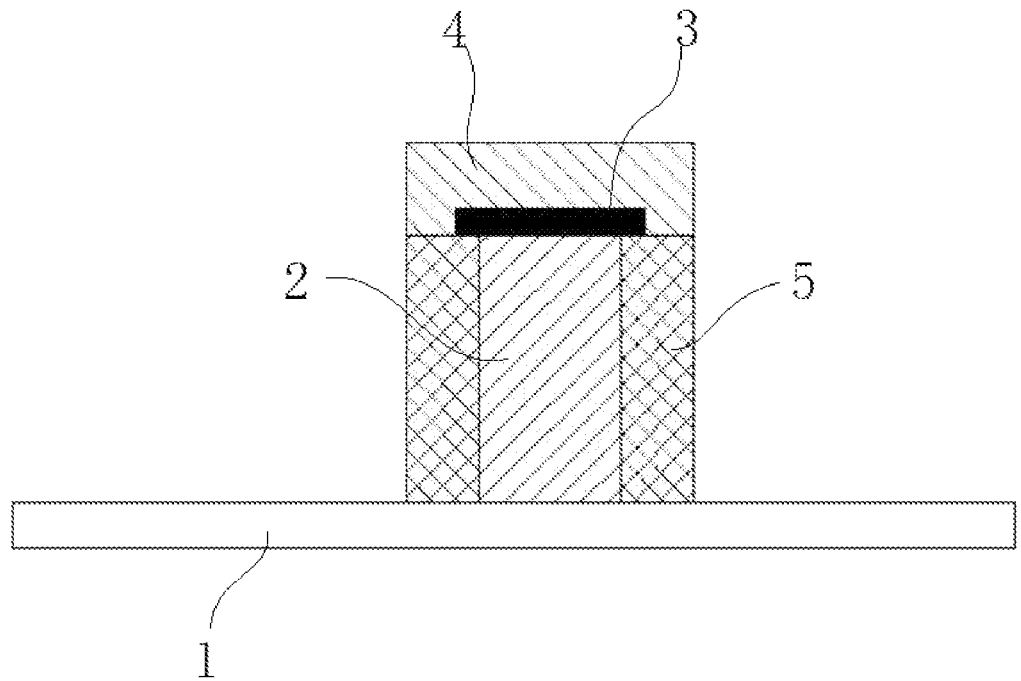
FIG. 1 is a cross sectional view showing the assembly of a metal circuit structure based on a flexible printed circuit (FPC) according to the present invention.
Figure 2:
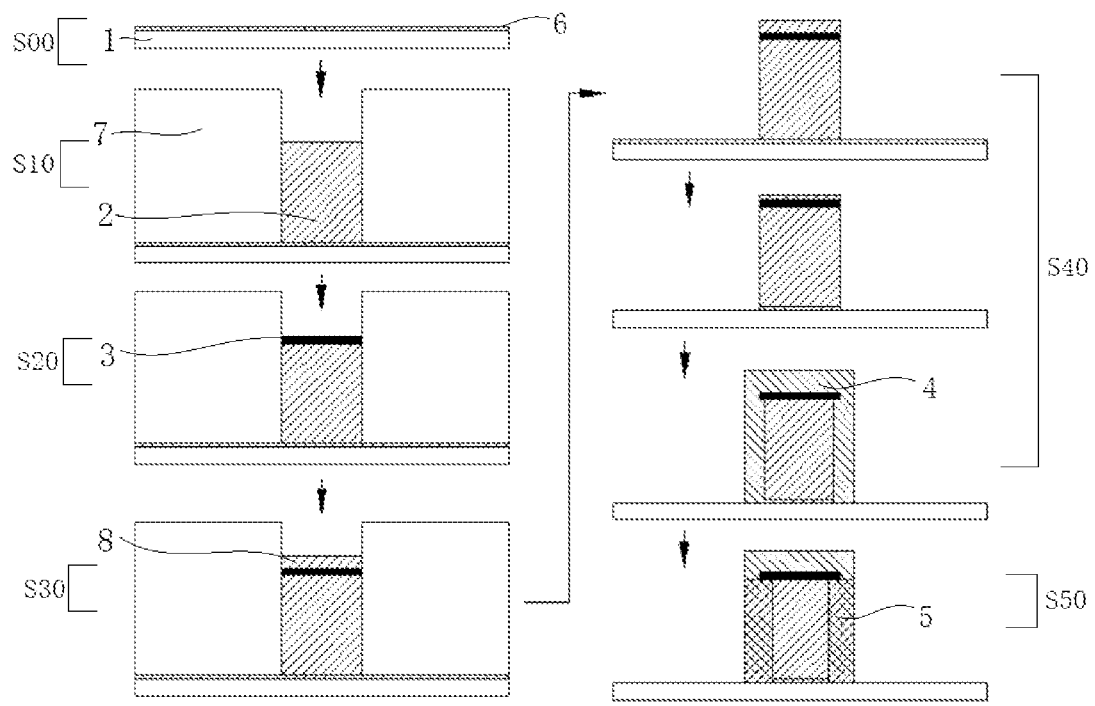
FIG. 2 is a cross sectional view showing the method of making the metal circuit structure based on the flexible printed circuit (FPC) according to the present invention.

With reference to FIGS. 1-2, a metal circuit structure based on a flexible printed circuit (FPC) and a method of making the same according to a first embodiment of the present invention comprises: a substrate 1 which is a film, a first metal layer 2, a second metal layer 4, and an intermediate layer 3. The first metal layer 2 is attached on the substrate 1, the second metal layer 4 is formed on the first metal layer 2, the intermediate layer 3 is defined between the first metal layer 2 and the second metal layer 4, a first surface of the intermediate layer 3 is connected with the first metal layer 2, and a second surface of the intermediate layer 3 is connected with the second metal layer 4, wherein the intermediate layer 3 is made of a first material, the second metal layer 4 is made of a second material, and the first material of the intermediate layer 3 does not act with the second material of the second metal layer 4.

The intermediate layer 3 is defined between the first metal layer 2 and the second metal layer 4 so as to separate the first metal layer 2 from the second metal layer 4, such that a thickness of the second metal layer 4 is limited within a predetermined range to avoid a removal of a circuit from the substrate 1.

Preferably, the intermediate layer 3 is made of any one or at least two of titanium, nickel, chromium, molybdenum, tungsten, cobalt, vanadium, and niobium. Preferably, the intermediate layer 3 is nickel so as to reduce fabrication cost.

The first metal layer 2 is made of copper, wherein a thickness of the first metal layer 2 is 1 μm to 12 μm, and a preferred thickness of the first metal layer 2 is 8 μm to 10 μm, thus obtaining a balance of a processing performance and a conductivity of the first metal layer 2.

The second metal layer 4 is made of tin, and a thickness of the second metal layer 4 is 100 nm to 200 nm.

The metal circuit structure further comprises: two third metal layers 5 formed on two sides of the first metal layer 2.

The third metal layer 5 is made of speculum metal.

A thickness of the intermediate layer 3 is 5 nm to 50 nm. Preferably, a thickness of the intermediate layer 3 is 30 nm so as to separate the first metal layer 2 from the second metal layer 4.

Referring to FIG. 2, a method of making the metal circuit structure based on the FPC comprises steps of:

S00) sputtering metal atoms on the substrate 1 so as to form a seed layer 6 and adhering a photoresist film on the seed layer 6 to execute exposure and developing treatment so that a portion of the seed layer 6 on which no metal circuit is arranged, is covered by a photoresist 7;

S10) plating copper on the substrate 1 so as to form the first metal layer 2;

S20) forming the intermediate layer 3 on the first metal layer 2;

S30) plating copper on the intermediate layer 3 so as to form a copper layer 8;

S40) washing the photoresist 7 away and having micro-nano etching on the substrate 1 until the portion of the seed layer 6 on which no metal circuit is arranged, is etched completely, and having immersion tin on the circuit;

S50) backing the first metal layer 2 after steps of S10) and S20 so as to release stress form the first metal layer 2 and to maintain a stable crystalline state.

In a first embodiment, the first metal layer 2 is made of copper and has a thickness of 8 μm, the intermediate layer 3 is made of nickel, and a thickness of the intermediate layer 3 is 30 nm. The second metal layer 4 is made of tin, and a thickness of the second metal layer 4 is 100 nm, wherein the thicknesses of the first metal layer 2, the intermediate layer 3, and the second metal layer 4 remain unchanged after being baked.

In a second embodiment, the first metal layer 2 is made of copper and a thickness of the first metal layer 2 is 8 μm, the intermediate layer 3 is made of nickel and a thickness of the intermediate layer 3 is 30 nm, and the second metal layer 4 is made of tin and a thickness of the second metal layer 4 is 200 nm, wherein the thicknesses of the first metal layer 2, the intermediate layer 3, and the second metal layer 4 remain unchanged after being baked.

In a third embodiment, the first metal layer 2 is made of copper and a thickness of the first metal layer 2 is 8 μm, the intermediate layer 3 is made of nickel and a thickness of the intermediate layer 3 is 30 nm, and the second metal layer 4 is made of tin and a thickness of the second metal layer 4 is 160 nm, wherein the thicknesses of the first metal layer 2, the intermediate layer 3, and the second metal layer 4 remain unchanged after being baked.

In a fourth embodiment, the first metal layer 2 is made of copper and a thickness of the first metal layer 2 is 8 μm, the intermediate layer 3 is made of nickel and a thickness of the intermediate layer 3 is 4 nm, and the second metal layer 4 is made of tin and a thickness of the second metal layer 4 is 160 nm, wherein the intermediate layer 3 has speculum metal after being baked.

In a fifth embodiment, the first metal layer 2 is made of copper and a thickness of the first metal layer 2 is 8 μm, the intermediate layer 3 is made of nickel and a thickness of the intermediate layer 3 is 50 nm, and the second metal layer 4 is made of tin and a thickness of the second metal layer 4 is 160 nm, wherein the thicknesses of the first metal layer 2, the intermediate layer 3, and the second metal layer 4 remain unchanged after being baked.

Figure 3:
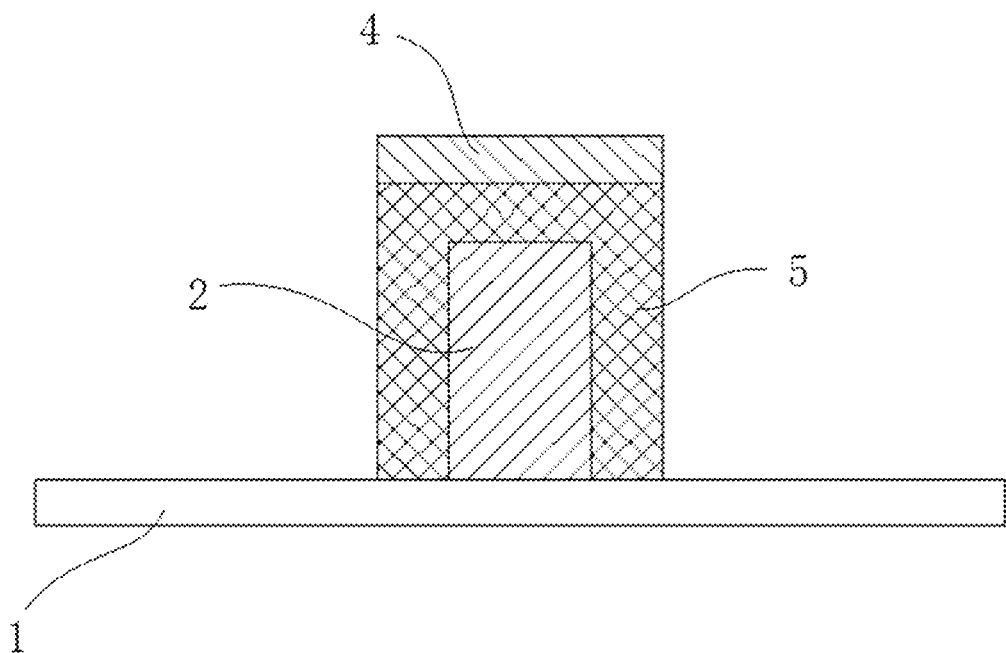
FIG. 3 is a cross sectional view showing the assembly of a conventional metal circuit structure based on a flexible printed circuit (FPC).

In comparison, as shown in FIG. 3, the first metal layer 2 is made of copper and is plated on the substrate 1, and a thickness of the first metal layer 2 is 8 μm. When having immersion tin on the circuit, the second metal layer 4 is made of tin and a thickness of the second metal layer 4 is 400 nm, wherein the third metal layer 5 is made of copper and tin so as to obtain speculum metal after being baked, a thickness of the copper is less than 8 μm, and a thickness of the tin is less than 200 nm.

A thickness of tin of a conventional circuit reduces after forming the intermediate layer 3 in a backing process so that the intermediate layer 3 is connected with a pin of a chip in a hot pressing manner so as to increase the thickness of the intermediate layer 3, thus enhancing isolation between copper and tin.

Conventionally, the thickness of tin of the circuit remain unchanged so as to reduce consumption of tin and a height of the circuit, thus avoiding the removal of the circuit from the substrate 1. When a thickness of tin of Chip On Flex (COF) is low, the pin is not welded on the chip. When the thickness of the tin is thick, the tin leaks in a welding process to contact with the circuit, thus causing a short circuit. Accordingly, the method of the present invention is applicable for COF.

While the preferred embodiments of the invention have been set forth for the purpose of disclosure, modifications of the disclosed embodiments of the invention as well as other embodiments thereof may occur to those skilled in the art. The scope of the claims should not be limited by the preferred embodiments set forth in the examples, but should be given the broadest interpretation consistent with the description as a whole.

What is claimed is:

1. A metal circuit structure based on a flexible printed circuit (FPC) comprising: a substrate; a copper layer attached on the substrate; a tin layer formed on the copper layer; an intermediate layer defined between the copper layer and the tin layer, wherein a first surface of the intermediate layer is connected with the copper layer, and a second surface of the intermediate layer is connected with the tin layer, wherein the intermediate layer comprises a first speculum metal layer to form the second surface, wherein the intermediate layer comprises a nickel layer to form the first surface; and two metal layers formed on two sides of the copper layer, wherein the two metal layers are each made of a second speculum metal.

2. The metal circuit structure as claimed in claim 1, wherein a thickness of the copper layer is 1 μm to 12 μm.

3. The metal circuit structure as claimed in claim 1, wherein a thickness of the tin layer is 100 nm to 200 nm.

* * * * *